United States Patent
Stengel et al.

(10) Patent No.: US 8,121,241 B2
(45) Date of Patent: Feb. 21, 2012

(54) METHOD AND APPARATUS FOR PROCESSING RADIO FREQUENCY SIGNALS

(75) Inventors: Robert E. Stengel, Pompano Beach, FL (US); Charles R. Ruelke, Margate, FL (US); Sumit A. Talwalkar, Plantation, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 702 days.

(21) Appl. No.: 12/241,005

(22) Filed: Sep. 29, 2008

(65) Prior Publication Data

US 2010/0080333 A1    Apr. 1, 2010

(51) Int. Cl.
*H04L 7/00* (2006.01)

(52) U.S. Cl. ........ 375/371; 375/136; 375/147; 375/280; 375/360; 375/362; 375/364; 375/370; 375/373; 375/375

(58) Field of Classification Search .................. 375/322, 375/371, 136, 147, 150, 280, 360, 362, 364, 375/370, 373, 375; 327/106, 113, 141; 455/255, 455/319, 324

See application file for complete search history.

(56) References Cited

U.S. PATENT DOCUMENTS

| | | | |
|---|---|---|---|
| 6,125,272 A | 9/2000 | Bautista et al. | |
| 6,192,225 B1* | 2/2001 | Arpaia et al. | 455/196.1 |
| 6,882,834 B1 | 4/2005 | Balboni | |
| 2005/0117680 A1* | 6/2005 | Raha et al. | 375/376 |
| 2007/0116015 A1* | 5/2007 | Jones | 370/396 |
| 2007/0164793 A1* | 7/2007 | Kim | 327/105 |

* cited by examiner

*Primary Examiner* — Dhaval Patel
(74) *Attorney, Agent, or Firm* — Barbara R. Doutre

(57) ABSTRACT

A method and apparatus for processing a radio frequency (RF) signal is provided. The method includes generating a periodic square wave local oscillator (LO) signal of a first phase, a periodic square wave LO signal of a second phase, and a chopping signal. The method further includes coding the periodic square wave LO signal of the first phase and the periodic square wave LO signal of the second phase synchronously with the chopping signal to generate a first set of synchronized signals (116, 118) and a second set of synchronized signals (120, 122), respectively. A phase difference between the first phase and the second phase is a predefined value. The RF signal is processed with the first set of synchronized signals (116, 118) and the second set of synchronized signals (120, 122) to obtain an in-phase intermediate frequency (IF) signal (132) and a quadrature-phase IF signal (142), respectively.

21 Claims, 6 Drawing Sheets

METHOD AND APPARATUS FOR PROCESSING RADIO FREQUENCY SIGNALS

FIELD OF THE INVENTION

The invention, in general, relates to communication systems. More particularly, the invention relates to a method and apparatus for processing radio frequency (RF) signals

BACKGROUND OF THE INVENTION

Direct conversion receivers (DCR) are employed for processing incoming signals, such as, RF signals. In typical operation, an RF signal is received by a pre-selector filter which may be a bandpass filter to reject spurious out-of-band signals. A filtered RF signal is passed into a low-noise amplifier (LNA) which amplifies the filtered RF signal. The amplified RF signal is then passed through an in-phase path and a quadrature-phase path for further processing.

Typically, the in-phase path includes a mixer and a filter. Similarly, the quadrature-phase path also includes a mixer and a filter. The mixers and the filters in the in-phase path and the quadrature-phase path down convert the RF signal to baseband. The mixers in typical DCRs may encounter low frequency noise and direct current (DC) offset error at baseband, due to non-ideal behavior of the mixers.

Chopping based DCRs are used to invert phases of mixer input and output signals in the in-phase path and quadrature-phase path, thereby mitigating the low frequency noise and the DC offset error at baseband. Chopping is controlled by a chopping signal generator. The controlling of the periodicity of the chopping signal may be used to shift non-idealities associated with the mixers away from a signal of interest at baseband. However, the inversion of the phase of the LO signal using a chopping signal may lead to the generation of LO signals bearing undesired short duration pulses and high frequency components. The undesired short duration pulses may lead to additional switching resulting in increased power dissipation.

Accordingly, there is a need for precluding undesired short duration pulses and high frequency components in LO signals.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the invention.

DETAILED DESCRIPTION OF THE INVENTION

Figure 1:
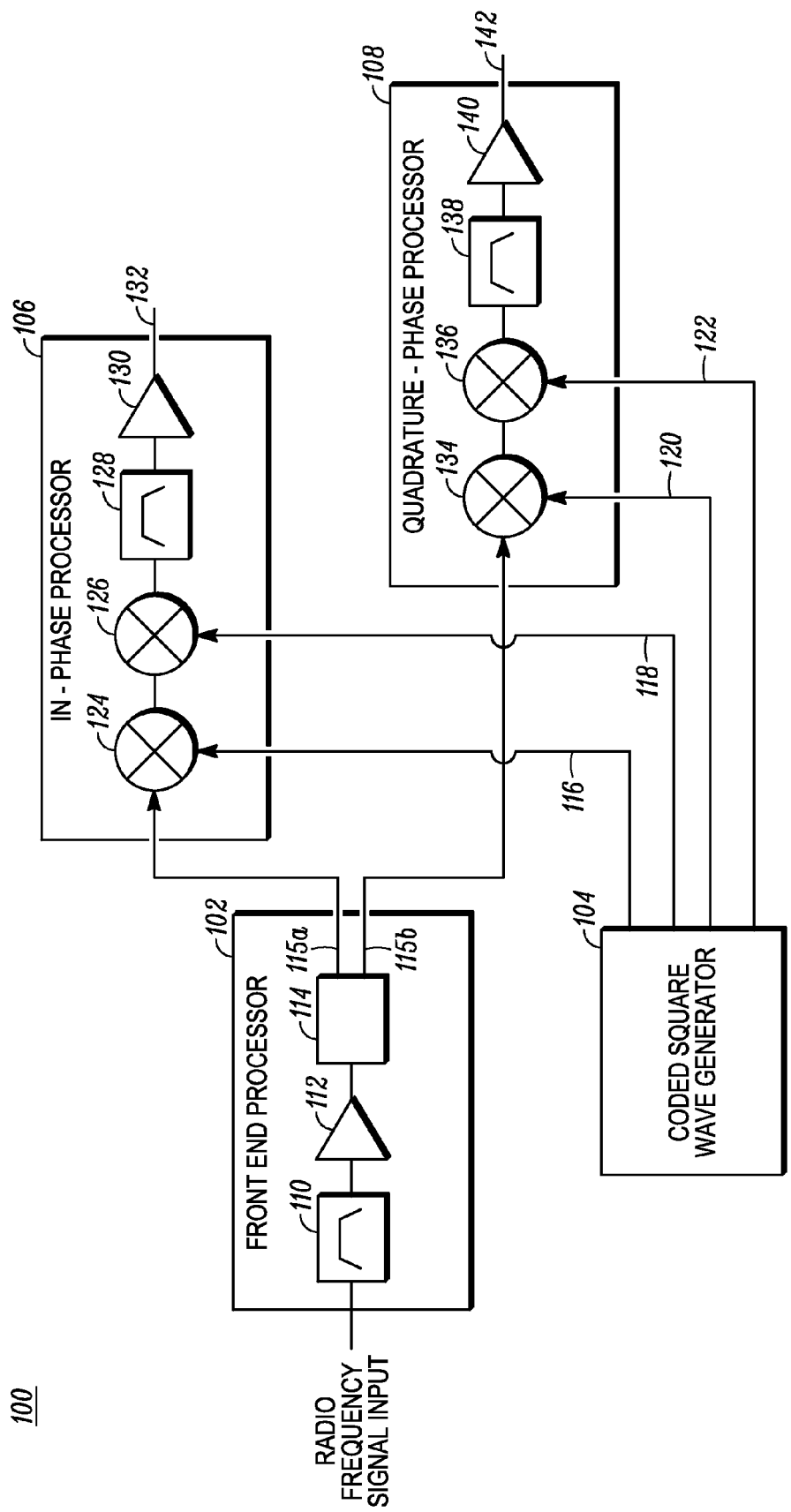
FIG. 1 illustrates a block diagram of a receiver for processing a radio frequency (RF) signal in accordance with an embodiment of the invention.

Before describing in detail embodiments that are in accordance with the present invention, it should be observed that the embodiments reside primarily in combinations of receiver components and method steps related to processing a radio frequency (RF) signal. Accordingly, the receiver components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

In this document, relational terms such as first and second, top and bottom and the like may be used solely to distinguish one entity or action from another entity or action without necessarily requiring or implying any actual such relationship or order between such entities or actions. The terms "comprises", "comprising", "has", "having", "includes", "including", "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art. The term "coupled" as used herein is defined as connected, although not necessarily directly and not necessarily mechanically. A device or structure that is "configured" in a certain way is configured in at least that way, but may also be configured in ways that are not listed.

Various embodiments of the invention provide a method and an apparatus for processing a radio frequency (RF) signal. The method includes generating a periodic square wave local oscillator (LO) signal of a first phase, a periodic square wave LO signal of a second phase, and a chopping signal. The method further includes coding the periodic square wave LO signal synchronously with the chopping signal to generate a first set of synchronized signals of a first phase and a second set of synchronized signals of a second phase. A phase difference between the first phase and the second phase is a predefined value. An in-phase intermediate frequency (IF) signal is obtained by processing the RF signal with the first set of synchronized signals in an in-phase path. Similarly, a quadrature-phase IF signal is obtained by processing the RF signal with the second set of synchronized signals in a quadrature-phase path.

FIG. 1 illustrates a block diagram of a receiver 100 for processing the RF signal in accordance with an embodiment of the invention. The receiver 100 processes the RF signal to generate an in-phase intermediate frequency (IF) signal and a quadrature-phase IF signal. The receiver 100 may be, for example, but is not limited to, a direct conversion receiver (DCR), a very low IF (VLIF) receiver, and a superheterodyne receiver. As depicted in FIG. 1, the receiver 100 includes a front end processor 102, a coded square wave generator (CSWG) 104, an in-phase processor 106, and a quadrature-phase processor 108. The front end processor 102 pre-processes an input RF signal to obtain a pre-processed RF signal. The front end processor 102 includes a filter 110, an amplifier 112, and a signal splitter 114. The filter 110 filters the input RF signal. Thereafter, the amplifier 112 amplifies the filtered RF signal to obtain an amplified RF signal. The amplifier 112 sends the amplified RF signal to the signal splitter 114. The signal splitter 114 then splits the amplified RF signal. Thereafter, the pre-processed RF signal, such as a pre-processed RF signal 115a and a pre-processed RF signal 115b is fed into an in-phase path and a quadrature-phase path, respectively. The signals generated by the front end processor 102 may be referred to as the pre-processed RF signal. The pre-processed RF signal 115a passed into the in-phase path. The pre-processed RF signal 115b is passed into the quadrature-phase path. The in-phase path and the quadrature-phase path may include the in-phase processor 106 and the quadrature-phase processor 108, respectively.

The CSWG 104 may be a direct digital synthesizer (DDS). The CSWG 104 performs direct digital synthesis by initially generating a periodic square wave LO signal of a first phase, a periodic square wave LO signal of a second phase, and a chopping signal. Thereafter, the direct digital synthesizer (the CSWG 104) processes the periodic square wave LO signal of the first phase and the chopping signal to generate a first set of synchronized signals. Further, the direct digital synthesizer (the CSWG 104) processes the periodic square wave LO signal of the second phase and the chopping signal to generate a second set of synchronized signals.

The CSWG 104 codes the periodic square wave LO signal of the first phase synchronously with the chopping signal to internally generate the first set of synchronized signals. The chopping signal may be one of a periodic signal and a non-periodic signal. The first set of synchronized signals includes a synchronized chopping encoded signal 116 and a synchronized chopping decoder control signal 118, which are brought out as output signals of the CSWG 104. The synchronized chopping encoded signal 116 is obtained by reversing the phase of the periodic square wave LO signal in response to each occurrence of an edge in the chopping signal. The phase reversal is accomplished by shifting the instantaneous phase by 180 degrees (i.e. a half cycle of the LO signal). The phase reversal of the periodic square wave LO signal of the first phase is effected at the first edge location of the periodic square wave LO signal of the first phase after the edge in the chopping signal. Further, the synchronized chopping decoder control signal 118 of the first set of the synchronized signals bears an edge at the first edge location of the periodic square wave LO signal of the first phase, after the edge in the chopping signal. A process of coding the periodic square wave LO signal of the first phase synchronously with a chopping signal to obtain a first set of synchronized signals is further explained in detail in FIG. 5.

The CSWG 104 also internally codes a periodic square wave LO signal of the second phase synchronously with the chopping signal to generate the second set of synchronized signals. The phase difference between the first phase and the second phase is a predefined value. In an embodiment, the phase difference between the first phase and the second phase may be 90 degrees. The second set of synchronized signals includes a synchronized chopping encoded signal 120 and a synchronized chopping decoder control signal 122, which are brought out as output signals of the CSWG 104. The synchronized chopping encoded signal 120 is obtained by reversing the phase of the periodic square wave LO signal in response to each occurrence of an edge in the chopping signal. Further, the synchronized chopping decoder control signal 122 of the second set of the synchronized signals bears an edge at the first edge location of the periodic square wave LO signal of the second phase, after the edge in the chopping signal. The phase reversal of the periodic square wave LO signal of the second phase is effected at the first edge location of the periodic square wave LO signal of the second phase after the edge in the chopping signal. A process of coding the periodic square wave LO signal of the second phase synchronously with a chopping signal to obtain a second set of synchronized signals is further explained in detail in FIG. 6.

Thereafter, the first set of synchronized signals 116, 118 is fed into the in-phase processor 106 and the second set of synchronized signals 120, 122 is fed into the quadrature-phase processor 108.

The in-phase processor 106 upon receiving the first set of synchronized signals 116, 118 generates the in-phase IF signal. The in-phase processor 106 includes a first mixer 124, a second mixer 126, a filter 128, and an amplifier 130. The first mixer 124 receives the pre-processed RF signal 115a and the synchronized chopping encoded signal 116. The pre-processed RF signal 115a may be mixed with the synchronized chopping encoded signal 116 to generate the first mixer 124 output signal.

In an embodiment, the second mixer 126 receives the synchronized chopping decoder control signal 118 and the first mixer 124 output signal. The second mixer 126 then mixes the first mixer 124 output signal with the synchronized chopping decoder control signal 118. The second mixer 126 output signal is received by the filter 128. The filter 128 filters the second mixer 126 output signal and sends a filtered output signal to the amplifier 130. The amplifier 130 then amplifies the filtered output signal to obtain an in-phase IF signal 132. Alternatively, in another embodiment, the filtering can take place after amplification. The in-phase IF signal 132 may have an intermediate frequency varying from zero to the frequency of the RF signal.

In yet another embodiment, the first mixer 124 output signal is received by the filter 128. The filter 128 filters the first mixer 124 output signal and sends a filtered output signal to the amplifier 130. Subsequently, the output of the amplifier 130 is mixed with the synchronized chopping decoder control signal 118 in the second mixer 126. It will be readily apparent to those of ordinary skill in the art that the decoder control signal 118 may need to be delayed in accordance with a delay in receiving the first mixer 124 output signal either pursuant to the filtering and the amplification or directly at the second mixer 126.

The quadrature-phase processor 108 upon receiving the second set of synchronized signals 120, 122 generates the quadrature-phase IF signal. The quadrature-phase processor 108 includes a first mixer 134, a second mixer 136, a filter 138, and an amplifier 140. The first mixer 134 receives the pre-processed RF signal 115*b* and the synchronized chopping encoded signal 120. The pre-processed RF signal 115*b* may be mixed with the synchronized chopping encoded signal 120 to generate the first mixer 134 output signal.

In an embodiment the second mixer 136 receives the synchronized chopping decoder control signal 122 and the first mixer 134 output signal. The second mixer 136 then mixes the first mixer 134 output signal with the synchronized chopping decoder control signal 122. The second mixer 136 output signal is received by the filter 138. The filter 138 filters the second mixer 136 output signal and sends a filtered output signal to the amplifier 140. The amplifier 140 then amplifies the filtered output signal to obtain a quadrature-phase IF signal 142. Alternatively, in another embodiment, the filtering can take place after amplification. The quadrature-phase IF signal 142 may have an intermediate frequency varying from zero to the frequency of the RF signal.

In yet another embodiment, the first mixer 134 output signal is received by the filter 138. The filter 138 filters the first mixer 134 output signal and sends a filtered output signal to the amplifier 140. Subsequently, the output of the amplifier 140 is mixed with synchronized chopping decoder control signal 122 in the second mixer 136. It will be readily apparent to those of ordinary skill in the art that the decoder control signal 122 may need to be delayed in accordance with a delay in receiving the first mixer 134 output signal either pursuant to the filtering and the amplification or directly at the second mixer 136.

As explained earlier, in FIG. 1, the CSWG 104 generates the periodic square wave LO signal and the chopping signal internally. Square waves, such as, the periodic square wave LO signal are utilized for the processing of the RF signal. Further, the frequency of the LO signal may or may not be harmonically related to a frequency associated with the chopping signal, when the chopping signal is a periodic signal. In either case the synchronous nature of coding ensures that the undesired short duration pulses are eliminated and the number of edges is reduced. The chopping signal may also be a non-periodic and pseudo-random signal. Given this free choice for the chopping signal, if synchronous mixing is not used, there is always a possibility of edges of the LO signal and the chopping signal falling arbitrarily close to each other, thus, requiring a creation of an arbitrarily short duration pulse that is beyond the capability of any practical circuit. The use of synchronous mixing as taught in this application excludes the possibility of necessity of generating arbitrarily short duration pulses. The reduction of the number of edges in turn results in reducing power dissipation in the receiver during processing of the chopping coded LO signal. The periodic square wave LO signal and the chopping signal, generated by the CSWG 104 are then processed to generate the first set of synchronized signals 116, 118 and the second set of synchronized signals 120, 122. However, in another embodiment, the periodic square wave LO signal and the chopping signal may be obtained from external sources, such as, for example, a square wave LO generator and a chopping oscillator. The generation of the periodic square wave LO signal and the chopping signal by the external sources, is explained in detail in conjunction with FIG. 2.

Figure 2:
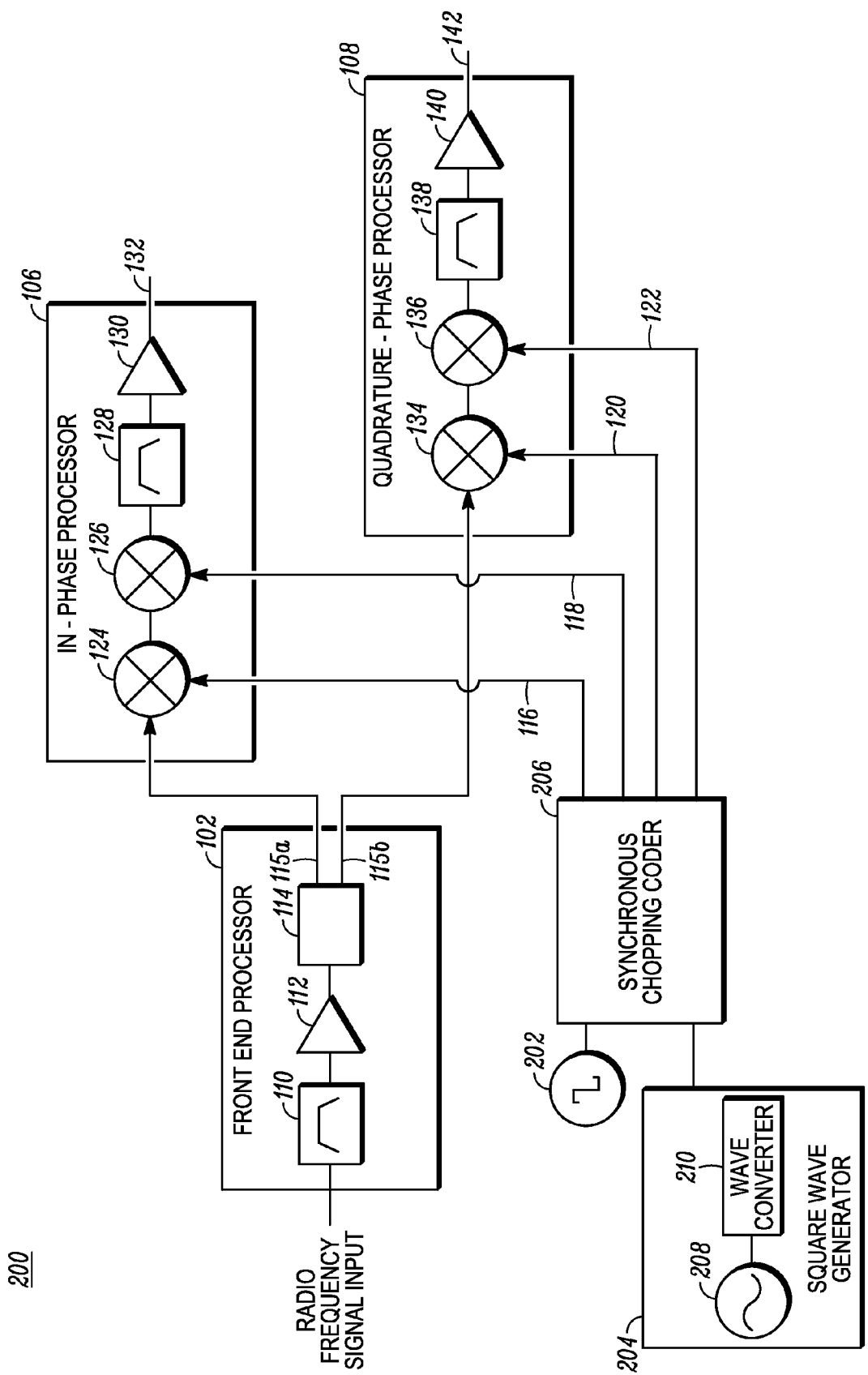
FIG. 2 illustrates a block diagram of a receiver for processing an RF signal in accordance with another embodiment of the invention.

FIG. 2 illustrates a block diagram of a receiver 200 for processing an RF signal in accordance with another embodiment of the invention. The receiver 200 includes a chopping oscillator 202, a square wave LO generator 204, and a synchronous chopping coder (SCC) 206. The receiver 200 may further include the front end processor 102, the in-phase processor 106, and the quadrature-phase processor 108 as depicted in FIG. 1.

The chopping oscillator 202 generates a chopping signal and transmits the chopping signal to the SCC 206. Further, the square wave LO generator 204 generates a periodic square wave LO signal and transmits the periodic square wave LO signal to the SCC 206. In an embodiment, the square wave LO generator 204 may include a local oscillator 208 and a wave converter 210. The wave convertor 210 is a sine wave to square wave convertor. The local oscillator 208 may generate an LO signal. The LO signal may be a sinusoidal wave. The LO signal may or may not have a frequency harmonically related to a frequency associated with the chopping signal, when the chopping signal is a periodic signal. The chopping signal may also be a non-periodic and pseudo-random signal. Thereafter, the LO signal may be transmitted to the wave converter 210. The wave converter 210 converts the LO signal into the periodic square wave LO signal. Subsequently, the wave converter 210 transmits the periodic square wave LO signal to the SCC 206.

Thereafter, the SCC 206 generates the first set of synchronized signals 116, 118 and the second set of synchronized signals 120, 122 by processing the periodic square wave LO signal and the chopping signal received from the chopping oscillator 202 and the square wave LO generator 204. The process of generating the first set of synchronized signals 116, 118 and the second set of synchronized signals 120, 122 is explained in detail in conjunction with FIG. 1.

Thereafter, the RF signal received from the front end processor 102 is processed with the first set of synchronized signals 116, 118 and the second set of synchronized signals 120, 122 to generate the in-phase IF signal and the quadrature-phase IF signal. The process of generating the in-phase IF signal and the quadrature-phase IF signal has been explained in detail in conjunction with FIG. 1.

The SCC 206 of the receiver 200 obtains the periodic square wave LO signal and the chopping signal from the square wave LO generator 204 and the chopping oscillator 202, respectively. Square waves generated by the square wave LO generator 204, are utilized by the receiver 200 for the processing the RF signal. The utilization of square waves enables introduction of potentially independent direct current (DC) offset correction via pulse width control. Thereafter, the SCC 206 processes the periodic square wave LO signal and the chopping signal to generate the first set of synchronized signals 116, 118 and the second set of synchronized signals 120, 122.

Figure 3:
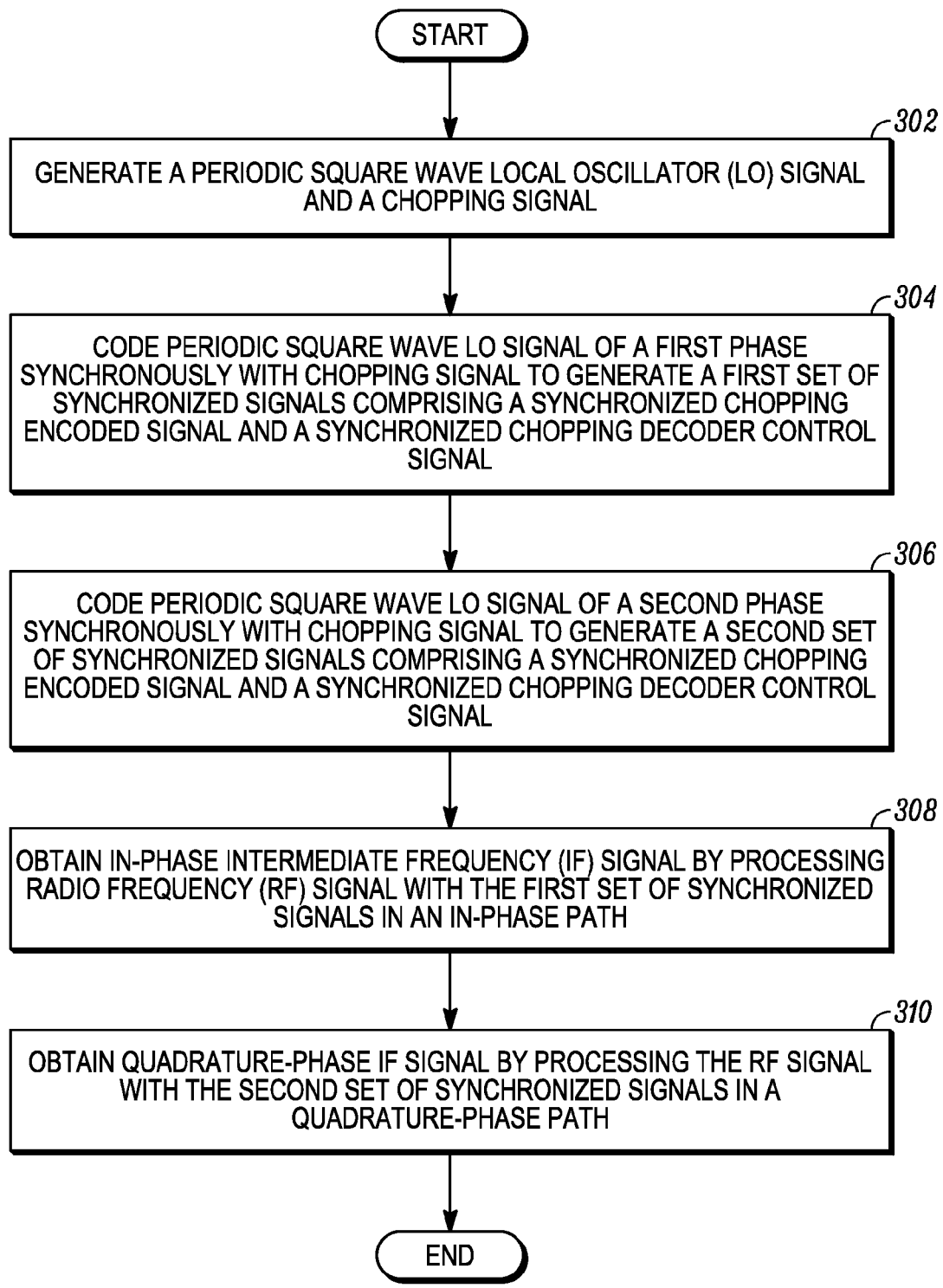
FIG. 3 illustrates a flow diagram of a method for processing an RF signal to generate an in-phase intermediate frequency (IF) signal and a quadrature-phase IF signal in accordance with an embodiment of the invention.

FIG. 3 illustrates a flow diagram of a method for processing an RF signal to generate an in-phase IF signal and a quadrature-phase IF signal in accordance with an embodiment of the invention. The RF signal may be a pre-processed RF signal, having been subjected to filtering, amplifying, and splitting, as explained in conjunction with FIG. 1 and FIG. 2.

At step 302, the periodic square wave LO signal of the first phase, the periodic square wave LO signal of the second phase, and the chopping signal are generated by the CSWG 104 of the receiver 100. In another embodiment, the square wave LO generator 204 of the receiver 200 generates the periodic square wave LO signal of the first phase and the periodic square wave LO signal of the second phase. The chopping oscillator 202 of the receiver 200 generates the chopping signal.

Thereafter, the periodic square wave LO signal is coded synchronously with the chopping signal by CSWG 104 as depicted in FIG. 1 or SCC 206 as depicted in FIG. 2 to generate the first set of synchronized signals 116, 118 and the second set of synchronized signals 120, 122. In response to coding the periodic square wave LO signal of the first phase synchronously with the chopping signal, the first set of synchronized signals 116, 118 of the first phase is generated, at step 304. An exemplary process of coding the periodic square wave LO signal of the first phase synchronously with the chopping signal is explained in further detail in conjunction with FIG. 4.

Considering the case of the receiver 200, the periodic square wave LO signal is obtained from the LO signal generated by the local oscillator 208. The LO signal processed to generate the periodic square wave LO signal may or may not have a frequency harmonically related with a frequency of the chopping signal. If an LO signal is not synchronously coded as taught in this application, and if the LO signal and the chopping signal have frequencies that are not harmonically related, undesired short duration pulses may be produced. Moreover, the undesired short duration pulses may also be produced when an LO signal and a chopping signal have frequencies that are harmonically related and phases associated with the LO signal and the chopping signal are such that transitions in the LO signal are very close to transitions in the chopping signal. Furthermore, the undesired short duration pulses may also be produced in the absence of synchronous mixing if the chopping signal is a non-periodic and pseudo-random signal. However, the synchronous coding eliminates the possibility of the undesired short duration pulses being generated in the synchronized chopping encoded signal 116 and the synchronized chopping encoded signal 120. Eliminating the undesired short duration pulses in the LO signal and the chopping signal can minimize power dissipation in the receiver 200.

Further, at step 306, the periodic square wave LO signal of the second phase is coded synchronously with the chopping signal to generate the second set of synchronized signals 120, 122 of the second phase. An exemplary process of coding the periodic square wave LO signal of the second phase synchronously with the chopping signal is explained in further detail in conjunction with FIG. 5.

A phase difference between the first phase and the second phase is a predefined value. In an embodiment, the phase difference between the first phase and the second phase may be 90 degrees. Thus, a relative phase difference of the periodic square wave LO signal in the first phase and the periodic square wave LO signal in the second phase, in this embodiment, is equivalent to a quarter cycle phase difference.

Thereafter, the first set of synchronized signals 116, 118 is fed into the in-phase processor 106 in the in-phase path and the second set of synchronized signals 120, 122 is fed into the quadrature-phase processor 108 in the quadrature-phase path for obtaining the in-phase IF signal and the quadrature-phase IF signal, respectively.

At step 308, the RF signal is processed with the first set of synchronized signals 116, 118 comprising the synchronized chopping encoded signal 116 and the synchronized chopping decoder control signal 118 in the in-phase path to obtain the in-phase IF signal. The in-phase processor 106 in the in-phase path processes the RF signal with the first set of synchronized signals 116, 118 to obtain the in-phase IF signal. A method of obtaining the in-phase IF signal by processing the RF signal with the first set of synchronized signals 116, 118 in the in-phase path is explained in further detail in conjunction with FIG. 6.

Similarly, at step 310, the RF signal is processed with the second set of synchronized signals 120, 122 comprising the synchronized chopping encoded signal 120 and the synchronized chopping decoder control signal 122 in the quadrature-phase path to obtain the quadrature-phase IF signal. The quadrature-phase processor 108 in the quadrature-phase path processes the RF signal with the second set of synchronized signals 120, 122 to obtain the quadrature-phase IF signal. A method of obtaining the quadrature-phase IF signal by processing the RF signal with the second set of synchronized signals 120, 122 in the quadrature-phase path is explained in further detail in conjunction with FIG. 7.

Figure 4:
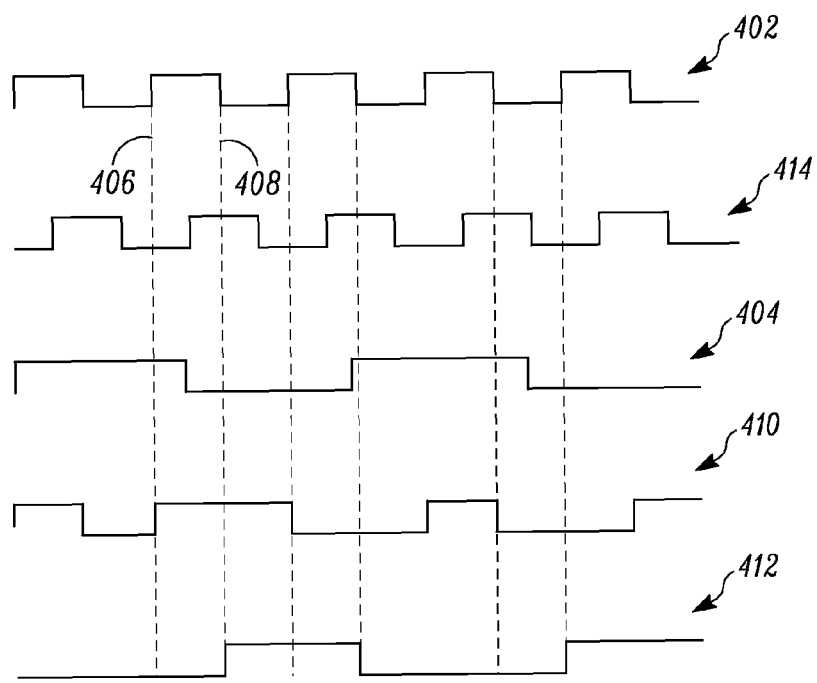
FIG. 4 illustrates an exemplary process for coding a periodic square wave LO signal of a first phase synchronously with a chopping signal to obtain a first set of synchronized signals in accordance with an embodiment of the invention.

FIG. 4 illustrates an exemplary process for coding a periodic square wave LO signal 402 of a first phase synchronously with a chopping signal 404 to obtain a first set of synchronized signals in accordance with an embodiment of the invention. The coding of the periodic square wave LO signal 402 synchronously with the chopping signal 404 involves identifying half-cycle intervals of the periodic square wave LO signal 402 that contain an edge of the chopping signal 404. Thereafter, the periodic square wave LO signal 402 and the chopping signal 404 are coded based on the identified half-cycle intervals.

For example, consider a half-cycle interval between a dotted line 406 and a dotted line 408 containing an edge of the chopping signal 404, as shown in FIG. 4. A resultant wave of the synchronous coding process, such as, a synchronized chopping encoded signal 410 bears an edge at every edge location of the periodic square wave LO signal 402 except at the end of the half-cycle interval of the periodic square wave LO signal 402. Further, another resultant wave of the synchronous coding process, such as, a synchronized chopping decoder control signal 412 bears an edge at an end of the half-cycle interval of the periodic square wave LO signal 402. Further, an exemplary process for coding a periodic square wave LO signal 414 of a second phase synchronously with the chopping signal 404 is explained in detail in conjunction with FIG. 5.

Figure 5:
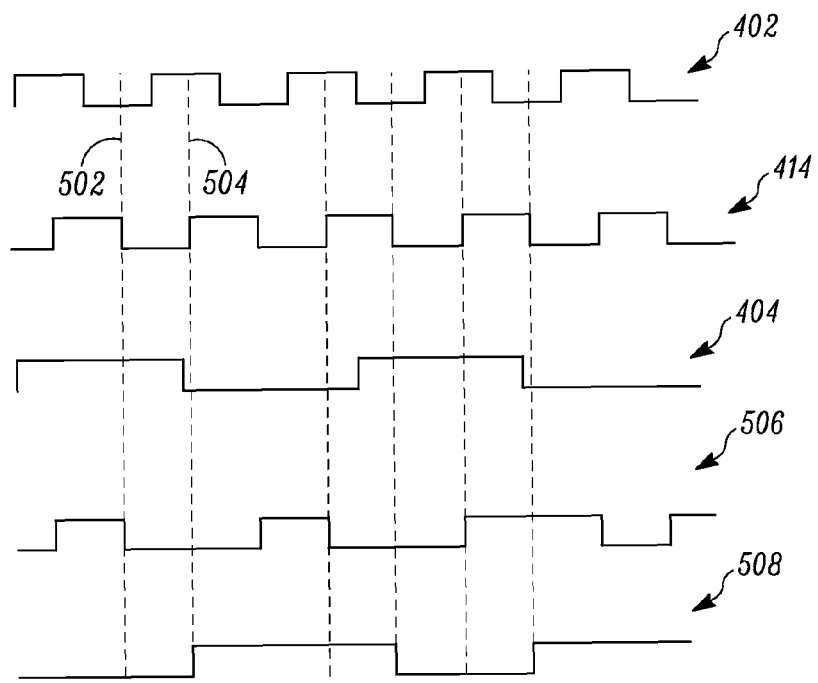
FIG. 5 illustrates an exemplary process for coding a periodic square wave LO signal of a second phase synchronously with the chopping signal to obtain a second set of synchronized signals in accordance with an embodiment of the invention.

FIG. 5 illustrates an exemplary process for coding the periodic square wave LO signal 414 of the second phase synchronously with the chopping signal 404 to obtain a second set of synchronized signals in accordance with an embodiment of the invention. The synchronous coding of the periodic square wave LO signal 414 with the chopping signal 404 involves identifying half-cycle intervals of the periodic square wave LO signal 414 that contain an edge of the chopping signal 404. Thereafter, the periodic square wave LO signal 414 and the chopping signal 404 are coded based on the identified half-cycle intervals.

For example, consider a half-cycle interval between a dotted line 502 and a dotted line 504 containing an edge of the chopping signal 404, as shown in FIG. 5. A resultant wave of the synchronous coding process, such as, the synchronized chopping encoded signal 506 bears an edge at every edge location of the periodic square wave LO signal 414 except at an end of the half-cycle interval of the periodic square wave LO signal 414. Further, another resultant wave of the synchronous coding process, such as, a synchronized chopping decoder control signal 508 bears an edge at an end of the half-cycle interval of the periodic square wave LO signal 414.

Figure 6:
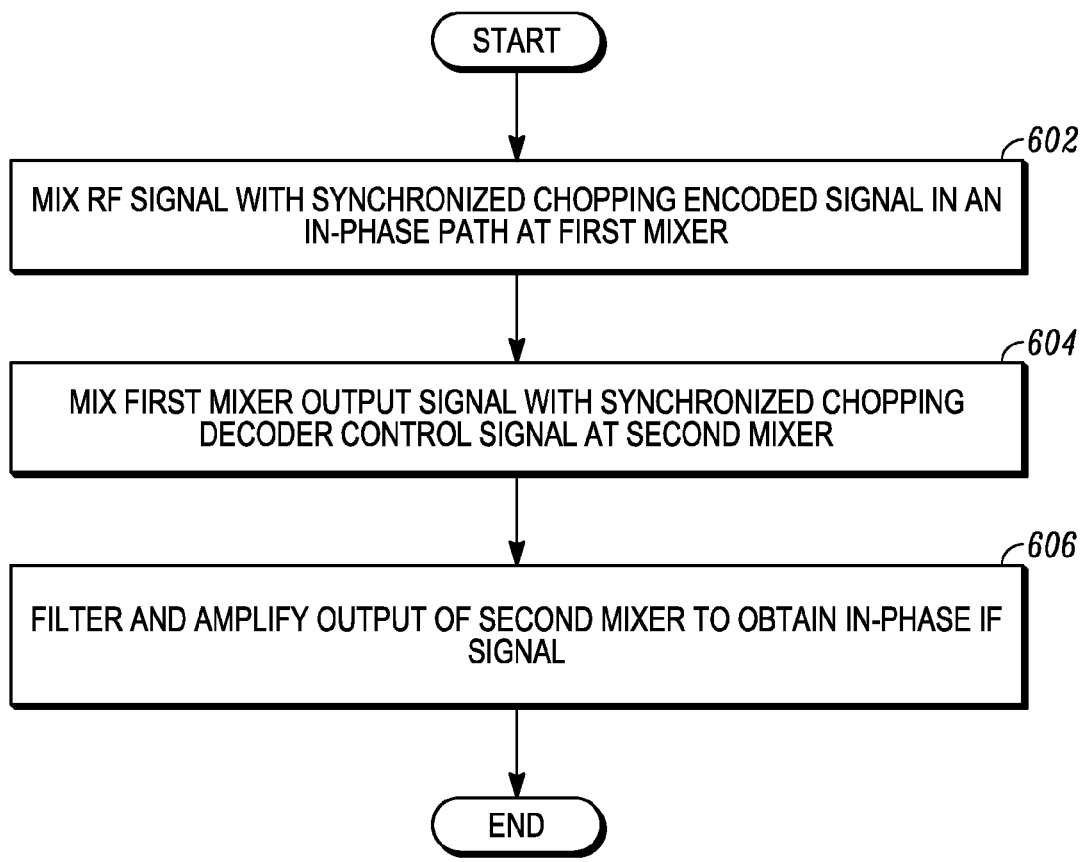
FIG. 6 illustrates a flow diagram of a method for obtaining an in-phase IF signal by processing the RF signal with a first set of synchronized signals in an in-phase path in accordance with an embodiment of the invention.

FIG. 6 illustrates a flow diagram of a method for obtaining the in-phase IF signal by processing the RF signal with the first set of synchronized signals 116,118 in the in-phase path in accordance with an embodiment of the invention. At step 602, the RF signal is mixed with the synchronized chopping encoded signal 116 in a first mixer. For example, the first mixer 124 in the in-phase path mixes the RF signal with the synchronized chopping encoded signal 116. The first mixer output signal is mixed with the synchronized chopping decoder control signal 118 at step 604. For example, the first mixer 124 output signal is fed into the second mixer 126. The second mixer 126 mixes the first mixer 124 output signal with the synchronized chopping decoder control signal 118. Further, at step 606, the second mixer output signal is filtered and amplified to generate the in-phase IF signal. For example, the filter 128 may receive the second mixer 126 output signal and thereafter filter the second mixer 126 output signal. The filtered output from the filter 128 is amplified by the amplifier 130 to obtain the in-phase IF signal. In another embodiment, the second mixer 126 output signal may be initially amplified by the amplifier 130 to obtain an amplified output. Subsequently, the amplified output from the amplifier 130 may be filtered by the filter 128 to obtain the in-phase IF signal 132.

Figure 7:
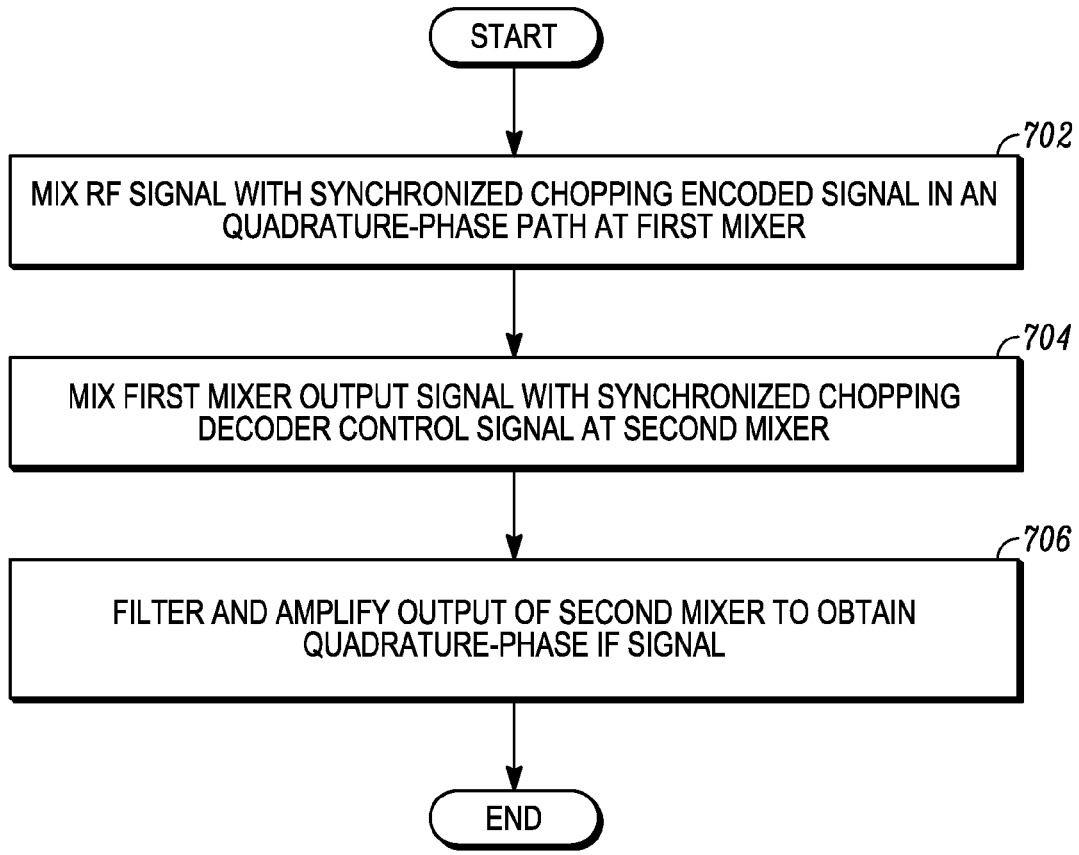
FIG. 7 illustrates a flow diagram of a method for obtaining a quadrature-phase IF signal by processing the RF signal with a second set of synchronized signals in a quadrature-phase path in accordance with an embodiment of the invention.

FIG. 7 illustrates a flow diagram of a method for obtaining the quadrature-phase IF signal by processing the RF signal with the second set of synchronized signals 120, 122 in the quadrature-phase path in accordance with an embodiment of the invention. At step 702, the RF signal is mixed with the synchronized chopping encoded signal 120 in a first mixer. For example, the first mixer 134 in the quadrature-phase path mixes the RF signal with the synchronized chopping encoded signal 120. The first mixer output signal is mixed with the synchronized chopping decoder control signal 122 at step 704. For example, the first mixer 134 output signal is fed into the second mixer 136. The second mixer 136 mixes the first mixer 134 output signal with the synchronized chopping decoder control signal 122. Further, at step 706, the second mixer output signal is filtered and amplified to generate the quadrature-phase IF signal. For example, the filter 138 may receive the second mixer 136 output signal and thereafter filter the second mixer 136 output signal. The filtered output from the filter 138 is amplified by the amplifier 140 to obtain the quadrature-phase IF signal. Alternatively, the second mixer 136 output signal may be initially amplified by the amplifier 140 to obtain an amplified output. Subsequently, the amplified output from the amplifier 140 may be filtered by the filter 138 to obtain the quadrature-phase IF signal 142.

Various embodiments of the present invention provide methods and apparatus for processing an RF signal. The apparatus, such as, a receiver includes a coded square wave generator (CSWG) that inverts a periodic square wave LO signal synchronously, when an input chopping signal is non-periodic or periodic, with a frequency that is harmonically not related to the frequency of the periodic square wave LO signal. The synchronous coding eliminates the possibility of undesired short duration pulses in the synchronized chopping encoded signal of a first phase and the synchronized chopping encoded signal of a second phase. As a result, power dissipation can be minimized.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of the invention. The benefits, advantages, solutions to problems and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method of processing a radio frequency (RF) signal, the method comprising:
    generating a periodic square wave local oscillator (LO) signal of a first phase, a periodic square wave LO signal of a second phase, and a chopping signal, wherein a phase difference between the first phase and the second phase is a predefined value;
    coding the periodic square wave LO signal of the first phase synchronously with the chopping signal to generate a first set of synchronized signals comprising a synchronized chopping encoded signal and a synchronized chopping decoder control signal;
    coding the periodic square wave LO signal of the second phase synchronously with the chopping signal to generate a second set of synchronized signals comprising a synchronized chopping encoded signal and a synchronized chopping decoder control signal;
    obtaining an in-phase intermediate frequency (IF) signal by processing the RF signal with the first set of synchronized signals in an in-phase path; and
    obtaining a quadrature-phase intermediate frequency (IF) signal by processing the RF signal with the second set of synchronized signals in a quadrature-phase path; and
    wherein each transition in the chopping signal produces the phase reversal of the LO signal of the first phase to produce the synchronized chopping encoded signal for the in-phase path at a different point in time than the phase reversal of the LO signal of the second phase to produce the synchronized chopping encoded signal for the quadrature-phase path.

2. The method of claim 1, wherein the RF signal is a pre-processed RF signal, the pre-processed RF signal obtained by pre-processing an input RF signal, the pre-processing comprising filtering, amplifying, and splitting of the input RF signal.

3. The method of claim 2, wherein the RF signal is received in the in-phase path and the quadrature-phase path in response to the splitting of the RF signal.

4. The method of claim 1, wherein the chopping signal is one of a periodic signal and a non-periodic signal.

5. The method of claim 1, wherein the synchronized chopping encoded signal of the first set of the synchronized signals is obtained by reversing the phase of the periodic square wave LO signal of the first phase, the phase reversal comprising shifting instantaneous phase by 180 degrees or a half cycle of the periodic LO signal, in response to each occurrence of an edge in the chopping signal, wherein the phase reversal of the periodic square wave LO signal is effected at a first edge location of the periodic square wave LO signal after the edge in the chopping signal.

6. The method of claim 1, wherein the synchronized chopping decoder control signal of the first set of the synchronized signals bears an edge at a first edge location of the periodic square wave LO signal of the first phase, after an edge in the chopping signal.

7. The method of claim 1, wherein the processing of the RF signal with the first set of synchronized signals in the in-phase path comprises:
    mixing the RF signal with the synchronized chopping encoded signal of the first set of the synchronized signals in the in-phase path at a first mixer;
    mixing the output of the first mixer with the synchronized chopping decoder control signal of the first set of the synchronized signals at a second mixer; and
    filtering and amplifying the output of the second mixer to obtain the in-phase IF signal.

8. The method of claim 1, wherein the synchronized chopping encoded signal of the second set of the synchronized signals is obtained by reversing the phase of the periodic square wave LO signal of the second phase, the phase reversal comprising shifting instantaneous phase by 180 degrees or a half cycle of the periodic LO signal of the second phase, in response to each occurrence of an edge in the chopping signal, wherein the phase reversal of the periodic square wave LO signal is effected at a first edge location of the periodic square wave LO signal after the edge in the chopping signal.

9. The method of claim 1, wherein the synchronized chopping decoder control signal of the second set of the synchronized signals bears an edge at a first edge location of the periodic square wave LO signal of the second phase, after an edge in the chopping signal.

10. The method of claim 1, wherein the processing of the RF signal with the second set of synchronized signals in the quadrature-phase path comprises:
mixing the RF signal with the synchronized chopping encoded signal of the second set of the synchronized signals in the quadrature-phase path at a first mixer;
mixing the output of the first mixer with the synchronized chopping decoder of the second set of the synchronized signals control signal at a second mixer; and
filtering and amplifying the output of the second mixer to obtain the quadrature-phase IF signal.

11. The method of claim 1, wherein intermediate frequency associated with the in-phase IF signal and quadrature-phase IF signal ranges from zero to about the frequency of the RF signal.

12. The method of claim 1, wherein the synchronized chopping decoder control signal for the in-phase path and the synchronized chopping decoder control signal for the quadrature-phase path produce transitions at different points in time for each transition in the chopping signal.

13. A receiver for processing a radio frequency (RF) signal, the receiver comprising:
a coded square wave generator (CSWG) for:
coding a periodic square wave local oscillator (LO) signal of a first phase synchronously with a chopping signal to generate a first set of synchronized signals comprising a synchronized chopping encoded signal and a synchronized chopping decoder control signal; and
coding a periodic square wave LO signal of a second phase synchronously with a chopping signal to generate a second set of synchronized signals comprising a synchronized chopping encoded signal and a synchronized chopping decoder control signal, wherein a phase difference between the first phase and the second phase is a predefined value;
an in-phase processor for generating an in-phase intermediate frequency (IF) signal by processing the RF signal with the first set of synchronized signals in an in-phase path; and
a quadrature-phase processor for generating a quadrature-phase IF signal by processing the RF signal with the second set of synchronized signals in a quadrature-phase path; and
wherein each transition in the chopping signal produces the phase reversal of the LO signal of the first phase to produce the synchronized chopping encoded signal for the in-phase path at a different point in time than the phase reversal of the LO signal of the second phase to produce the synchronized chopping encoded signal for the quadrature-phase path.

14. The receiver of claim 13 further comprising a front end processor configured to:
obtain the RF signal by pre-processing an input RF signal, wherein the pre-processing comprises filtering, amplifying, and splitting of the input RF signal;
feed the RF signal into the in-phase path and the quadrature-phase path.

15. The receiver of claim 13, wherein the CSWG is further configured to:
generate the periodic square wave LO signal; and
generate the chopping signal.

16. The receiver of claim 13, wherein the CSWG comprises a direct digital synthesizer (DDS).

17. The receiver of claim 13, wherein the CSWG comprises a synchronous chopping coder (SCC).

18. The receiver of claim 17 further comprising:
a square wave LO generator for generating the periodic square wave LO signal and transmitting the periodic square wave LO signal to the SCC, wherein the square LO wave generator comprises:
a local oscillator for generating a sinusoidal wave, and
a wave converter for converting the sinusoidal wave into the periodic square wave LO signal; and
a chopping oscillator for generating the chopping signal and transmitting the chopping signal to the SCC.

19. The receiver of claim 13, wherein the in-phase processor comprises:
a first mixer for mixing the RF signal with the synchronized chopping encoded signal of the first set of the synchronized signals in the in-phase path;
a second mixer for mixing the output of the first mixer with the synchronized chopping decoder control signal of the first set of the synchronized signals;
a filter for filtering the output of the second mixer; and
an amplifier for amplifying the output of the second mixer.

20. The receiver of claim 13, wherein the quadrature-phase processor comprises:
a first mixer for mixing the RF signal with the synchronized chopping encoded signal of the second set of the synchronized signals in the quadrature-phase path;
a second mixer for mixing output of the first mixer with the synchronized chopping decoder control signal of the second set of the synchronized signals;
a filter for filtering the output of the second mixer; and
an amplifier for amplifying the output of the second mixer.

21. The receiver of claim 13, wherein the synchronized chopping decoder control signal for the in-phase path and the synchronized chopping decoder control signal for the quadrature-phase path produce transitions at different points in time for each transition in the chopping signal.

* * * * *